(12) United States Patent
Liu et al.

(10) Patent No.: US 9,674,950 B1
(45) Date of Patent: Jun. 6, 2017

(54) METHODS OF STITCHING COMPONENTS ON FABRICS USING METAL FOILS

(71) Applicant: Flextronics AP, LLC, Broomfield, CO (US)

(72) Inventors: Weifeng Liu, Dublin, CA (US); Zhen Feng, San Jose, CA (US); Anwar Mohammed, San Jose, CA (US)

(73) Assignee: Flextronics AP, LLC, Broomfield, CO (US)

(*) Notice: Subject to any disclaimer, the term of this patent is extended or adjusted under 35 U.S.C. 154(b) by 204 days.

(21) Appl. No.: 14/268,775

(22) Filed: May 2, 2014

Related U.S. Application Data

(60) Provisional application No. 61/913,830, filed on Dec. 9, 2013.

(51) Int. Cl.
| | | |
|---|---|---|
| *H05K 1/11* | (2006.01) | |
| *H05K 1/14* | (2006.01) | |
| *H05K 1/03* | (2006.01) | |
| *H05K 3/32* | (2006.01) | |

(52) U.S. Cl.
CPC ............. *H05K 1/038* (2013.01); *H05K 1/111* (2013.01); *H05K 3/32* (2013.01)

(58) Field of Classification Search
CPC ......... H05K 2201/10734; H05K 1/111; H05K 1/141
USPC .......................................................... 361/767
See application file for complete search history.

(56) References Cited

U.S. PATENT DOCUMENTS

| | | | |
|---|---|---|---|
| 3,951,493 A | 4/1976 | Kozel | |
| 5,184,827 A | 2/1993 | Suttle | |
| 5,259,833 A | 11/1993 | Barnett | |
| 5,764,498 A | 6/1998 | Sundstrom | |
| 5,900,587 A | 5/1999 | Piper | |
| 6,160,254 A | 12/2000 | Zimmerman | |
| 6,797,881 B2 | 9/2004 | Nakamura | |
| 7,319,895 B2 * | 1/2008 | Klefstad-Sillonville | A41D 13/1281 600/388 |
| 7,629,691 B2 | 12/2009 | Roush | |
| 7,641,488 B2 | 1/2010 | Ho | |
| 8,294,031 B2 | 10/2012 | Bagung | |
| 8,469,741 B2 | 6/2013 | Oster | |
| 2004/0243204 A1 | 12/2004 | Maghribi | |
| 2004/0259391 A1 | 12/2004 | Jung | |
| 2005/0034485 A1 * | 2/2005 | Klefstad-Sillonville | A41D 13/1281 66/171 |
| 2007/0125295 A1 | 6/2007 | Sanguinetti | |
| 2008/0060873 A1 | 3/2008 | Lang | |
| 2008/0182475 A1 * | 7/2008 | Gnade | D03D 1/00 445/3 |
| 2008/0223844 A1 * | 9/2008 | Cronn | A41D 13/0051 219/211 |

(Continued)

*Primary Examiner* — Eric Thomas
*Assistant Examiner* — Michael P McFadden
(74) *Attorney, Agent, or Firm* — Haverstock & Owens LLP

(57) ABSTRACT

An electronics assembly includes one or more electronic components coupled to a fabric. Each electronic component includes one or more electrical connection points, such as a bond pad or solder bump. The electronics assembly also includes one or more metal foils, one metal foil coupled to one electrical connection point on an electronic component. The metal foil is stitched to the fabric by an electrically conductive wire, thereby providing an electrical connection between the electronic component and the electrically conductive wire via the metal foil.

22 Claims, 4 Drawing Sheets

(56) References Cited

U.S. PATENT DOCUMENTS

| | | |
|---|---|---|
| 2008/0241663 A1 | 10/2008 | Yamashita |
| 2008/0258314 A1 | 10/2008 | Yoo |
| 2009/0273460 A1 | 11/2009 | Mancosu |
| 2010/0090834 A1 | 4/2010 | Buchnick |
| 2011/0262785 A1 | 10/2011 | Johnson |
| 2012/0050036 A1 | 3/2012 | Landry |
| 2012/0176764 A1* | 7/2012 | Loher .................. H05K 1/0283 361/820 |
| 2013/0160183 A1 | 6/2013 | Reho |
| 2013/0161055 A1 | 6/2013 | Rule |
| 2013/0256004 A1 | 10/2013 | Cotton |
| 2014/0220422 A1 | 8/2014 | Rogers |
| 2014/0231793 A1 | 8/2014 | Rajan |
| 2014/0362020 A1 | 12/2014 | Rothkopf |
| 2015/0009129 A1 | 1/2015 | Song |
| 2015/0041201 A1 | 2/2015 | Van Heck |
| 2015/0091711 A1 | 4/2015 | Kosonen |
| 2015/0185944 A1 | 7/2015 | Magi |
| 2015/0312653 A1 | 10/2015 | Avrahami |
| 2016/0105950 A1 | 4/2016 | Drzaic |
| 2016/0183363 A1 | 6/2016 | Lee |
| 2016/0187122 A1 | 6/2016 | Krimon |

* cited by examiner

METHODS OF STITCHING COMPONENTS ON FABRICS USING METAL FOILS

RELATED APPLICATIONS

This Patent Application claims priority under 35 U.S.C. 119 (e) of the U.S. Provisional Application, Ser. No. 61/913,830, filed Dec. 9, 2013, and entitled "METAL FABRIC STITCHING AND STRETCHABLE BATTERIES". This application incorporates U.S. Provisional Application, Ser. No. 61/913,830 in its entirety by reference.

FIELD OF THE INVENTION

The present invention is generally directed to the field of wearable electronics. More specifically, the present invention is directed to wearable electronics fabric having an electronic component with electrical connectivity provided by stitched electrically conductive wire and metal foil.

BACKGROUND OF THE INVENTION

Electronic devices are increasingly being developed so as to be worn by a user, such as in wearable electronics. Many wearable electronics are designed as stand alone devices having an electronic component attached to band that is used for securing the device to a user, such as a wristwatch having a wrist-band or a heart-rate monitor having a band that wraps around a users chest. The electronic component of such devices often includes a housing with an integrated clasp or securing means for attaching to the band. Adhesive can also be used to secure the electronic component to the band. Instead of stand-alone devices, other wearable electronics are being integrated with clothing. Adhesives can also be used in these applications to secure the electronic component to a clothing fabric.

Metal wires are commonly used as electrical conductors between electronic devices. As applied to wearable electronics, providing electrical connectivity to or between one or more worn electrical devices is typically done using a separate electrical cable that includes a metal wire. However, having loose cables is often a nuisance and ungainly.

SUMMARY OF THE INVENTION

Embodiments of an electronics assembly are directed to one or more electronic components coupled to a fabric. Each of the one or more electronic components includes one or more electrical connection points, such as a bond pad or solder bump. The electronics assembly also includes one or more electrically conductive metal foils, one electrically conductive metal foil coupled to one electrical connection point on an electronic component. The electrically conductive metal foil is stitched to the fabric by an electrically conductive wire, thereby providing an electrical connection between the electronic component and the electrically conductive wire via the electrically conductive metal foil. In some embodiments, the electrically conductive metal foil is attached to the fabric by an adhesive. In other embodiments, the electrically conductive metal foil is attached to the fabric using a stitched thread, which can be either electrically insulated thread or another electrically conductive wire. In some embodiments, the fabric is an electronics fabric having one or more insulated wires woven into the fabric. In some embodiments, the insulated wire includes an inner metal wire and an outer insulation layer. The electrically conductive wire stitched to the fabric and to the electrically conductive metal foil can also be electrically coupled to the metal wire within the insulated wire of the fabric. In some embodiments, the fabric is a wearable fabric, such as a shirt or pants, or other form to be worn by a user, such as an armband, waistband, hat or shoes.

In an aspect, an electronics assembly is disclosed which includes a fabric, an electronic component, an electrically conductive metal foil and an electrically conductive wire. The electronic component includes an electrical connection point. The electrically conductive metal foil is coupled to the electrical connection point of the electronic component, wherein an electrical connection is formed between the electrically conductive metal foil and the electrical connection point. The electrically conductive wire is stitched to the fabric and to the metal foil such that an electrical connection is formed between the electrically conductive wire and the metal foil. In some embodiments, the electrical connection point is a bond pad. In other embodiments, the electrical connection point is a solder bump. In some embodiments, the electrical connection point is coupled to the metal foil via a solder joint, a welded joint or an electrically conductive adhesive. In some embodiments, the metal foil is coupled to the fabric using an adhesive. In other embodiments, the metal foil is coupled to the fabric using a stitched non-electrically conductive thread. In still other embodiments, the metal foil is coupled to the fabric using a second electrically conductive thread stitched to the fabric and to the metal foil. In some embodiments, the metal foil is made of one or more of copper, silver, nickel and their alloys. The metal foil can include an electrically conductive plating finish. In some embodiments, the electronics assembly also includes an encapsulation layer coupled to the electronics component, the metal foil and the electrically conductive wire. In some embodiments, the fabric includes an insulated wire including an inner metal wire and an outer insulation layer, wherein the electrically conductive wire is electrically coupled to the inner metal wire of the insulated wire. In some embodiments, the electrically conductive wire stitched to the fabric includes two separate wires, wherein the two separate wires include a metal wire and an insulation wire. In some embodiments, the electronics assembly is wearable.

In another aspect, a method of making an electronics assembly is disclosed. The method includes attaching an electrical connection point of an electronic component to a metal foil, thereby forming an electrical connection between the metal foil and the electrical connection point. The method also includes attaching the metal foil to a fabric, and stitching an electrically conductive wire to the fabric and to the metal foil such that an electrical connection is formed between the electrically conductive wire and the metal foil. In some embodiments, attaching the electrical connection point of the electronic component to the metal foil includes soldering, welding or using an electrically conductive adhesive. In some embodiments, attaching the metal foil to the fabric includes using an adhesive. In other embodiments, attaching the metal foil to the fabric includes stitching a non-electrically conductive thread to the metal foil and to the fabric. In still other embodiments, attaching the metal foil to the fabric includes stitching a second electrically conductive thread to the metal foil and to the fabric. In some embodiments, the method also includes adding an encapsulation layer coupled to the electronics component, the metal foil and the electrically conductive wire. In some embodiments, the fabric includes an insulated wire including an inner metal wire and an outer insulation layer, and the method further comprises electrically coupling the electrically conductive wire to the inner metal wire of the insulated wire. In some embodiments, the electrically conductive wire stitched to the fabric includes two separate wires, wherein the two separate wires include a metal wire and an insulation wire, and stitching the electrically conductive wire to the fabric includes stitching the two separate wires. In some embodiments, the electronics assembly is wearable.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an electronic component coupled to a fabric and methods of attaching the electronic component to the fabric. Those of ordinary skill in the art will realize that the following detailed description of the products and methods are illustrative only and is not intended to be in any way limiting. Other embodiments of the products and methods will readily suggest themselves to such skilled persons having the benefit of this disclosure.

Reference will now be made in detail to implementations of the products and methods as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
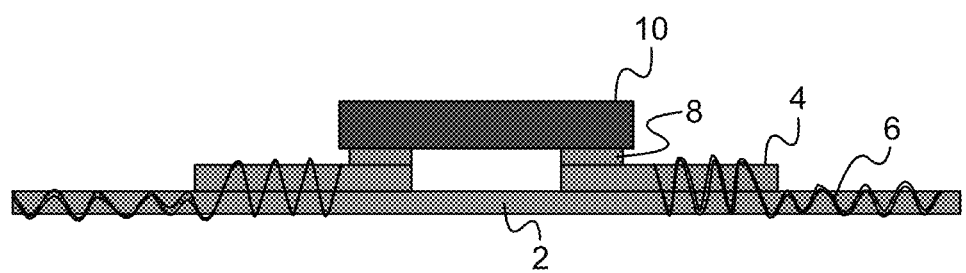
FIG. 1 illustrates a cut out side view of an electronic component coupled to a fabric according to an embodiment.

FIG. 1 illustrates a cut out side view of an electronic component coupled to a fabric according to an embodiment. As used herein, the term "fabric" generally applies to cloth or other similar materials made of threads, fibers, filaments or the like, generally referred to herein as "threads". Materials used for threads can include, but are not limited to, cotton, wool, nylon, polyester or other synthetic materials. An electronic component 10 is coupled to a fabric 2 via one or more electrically conductive metal foils 4. The electronic component 10 can be any conventional electronic component including, but not limited to, an active electronic component such as an integrated circuit, a passive electronic component such as a resistor, a capacitor and an inductor, and a power supply.

Off-component electrical connectivity can be provided by electrical connection points, such as electrical connection point 8. In the exemplary configuration shown in FIG. 1, the electronic component 10 includes two electrical connection points 8. It is understood that the electronic component can include more or less than two electrical connection points, and that the electrical connection points can be alternatively positioned than that shown in FIG. 1. Examples of electrical connection points include, but are not limited to, bond pads and solder bumps. It is understood that other types of conventional electrical connection points can be used. In some embodiments, there is one metal foil 4 coupled to each electrical connection point 8. The metal foil 4 can be attached by soldering, welding or using electrically conductive adhesive. It is understood that other conventional methods can be used to provide a mechanical and electrical connection between the electrical connection point and the metal foil.

As shown in FIG. 1, a first portion of the metal foil 4 is coupled to the electrical connection point 8 of the electronic component 10, and a second portion of the metal foil 4 extends beyond a footprint of the electronic component 10. The second portion of the metal foil 4 is stitched to the fabric 2 using an electrically conductive stitched wire 6. In some embodiments, the metal foil is configured as a strip having a first end and a second end. In some embodiments, the metal foil thickness is in the millimeter range, for example between about a few millimeters to sub-millimeter. In general, the metal foil is configured with a thickness that is thin enough to enable a stitching needle to penetrate the metal foil, a width greater than a diameter of the stitching needle and a length great enough so that the second portion extends beyond the footprint of the electronic component and provides sufficient area to stitch the second portion to the fabric.

In some embodiments, the metal foil is made of copper. It is understood that the metal foil can be made of other electrically conductive materials including, but not limited to, silver, steel, nickel, and their alloys. In some embodiments, the metal foil is coated with a plating finish to protect from corrosion and enhance electrical conductivity. Examples of such plating finish include, but are not limited to, gold flash over nickel, silver, or solder. The geometry of the metal foil 4 can vary by application. In an exemplary configuration, the metal foil 4 is rectangular. It is understood that the metal foil can be alternatively shaped. The shape can be symmetrical or asymmetrical. For example, the portion of the metal foil that is to be coupled to an electrical connection point can be tapered to account for tightly grouped electrical connection points.

The stitched wire 6 is coupled to the metal foil 4 and to the fabric 2 with sufficient force to provide an electrical connection between the metal foil 4 and the stitched wire 6. Although the primary function of the stitched wire 6 is to provide electrical connection to the metal foil 4, the stitched wire 6 provides a secondary function of securing the metal foil 4 to the fabric 2. However, in some embodiments, the stitched wire 6 is stitched to only a small area of the metal foil 4. Attaching a larger area of the metal foil 4 to the fabric 2 is typically advisable for increased durability and long term attachment. In some embodiments, the metal foil 4 is coupled to the fabric 2 by an adhesive. The adhesive can be any conventional adhesive sufficient to adhere a metal to a fabric, such as an epoxy or glue. In some embodiments, the adhesive is selectively applied such that none of the stitched wire passes through adhesive. In other embodiments, the metal foil 4 is coupled to the fabric 2 by another stitched thread, which can be either electrically conductive or electrically insulated. This stitched thread can be applied over a greater area of the metal foil 4 than the stitched wire 6. For example the stitched thread can be applied around a perimeter of the metal foil 4.

In some embodiments, the stitched wire 6 is stitched using any conventional stitching process that uses two threads. In this case, the stitched wire 6 includes two wires, a first wire is electrically conductive and a second wire, a bobbin wire, is electrically insulated so that the two wires do not short together. In some embodiments, the first wire is made of electrically conductive material such as metal, carbon fiber, nylon wire coated with silver finish, or metal particles embedded polymer wire. Examples of metal wire include, but are not limited to, copper, silver, steel, nickel or their alloys. The metal wire can also be coated with different finishes such as gold flash over nickel, silver or solder. In some embodiments, the second wire is made of electrically insulated material such as nylon or polyester. It is understood that alternative electrically conductive materials can be used for the first wire and alternative electrically insulated materials can be used for the second wire. For simplicity, the stitched wire is generally referred to herein as being electrically conductive, even in those configurations where a second insulated wire is used in the stitching process.

Figure 2:
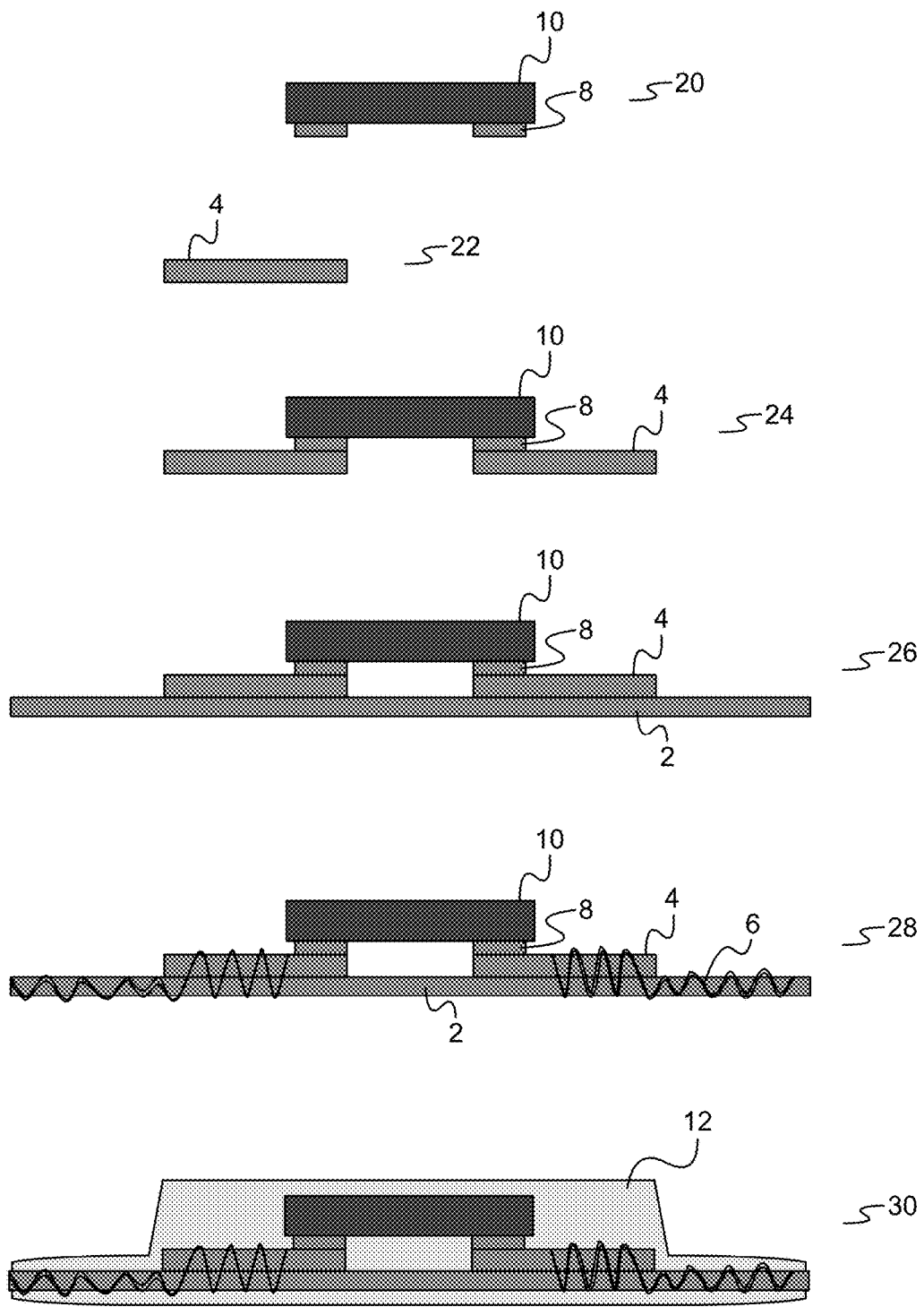
FIG. 2 illustrates a method of making an electronics assembly according to an embodiment.
Figure 3:
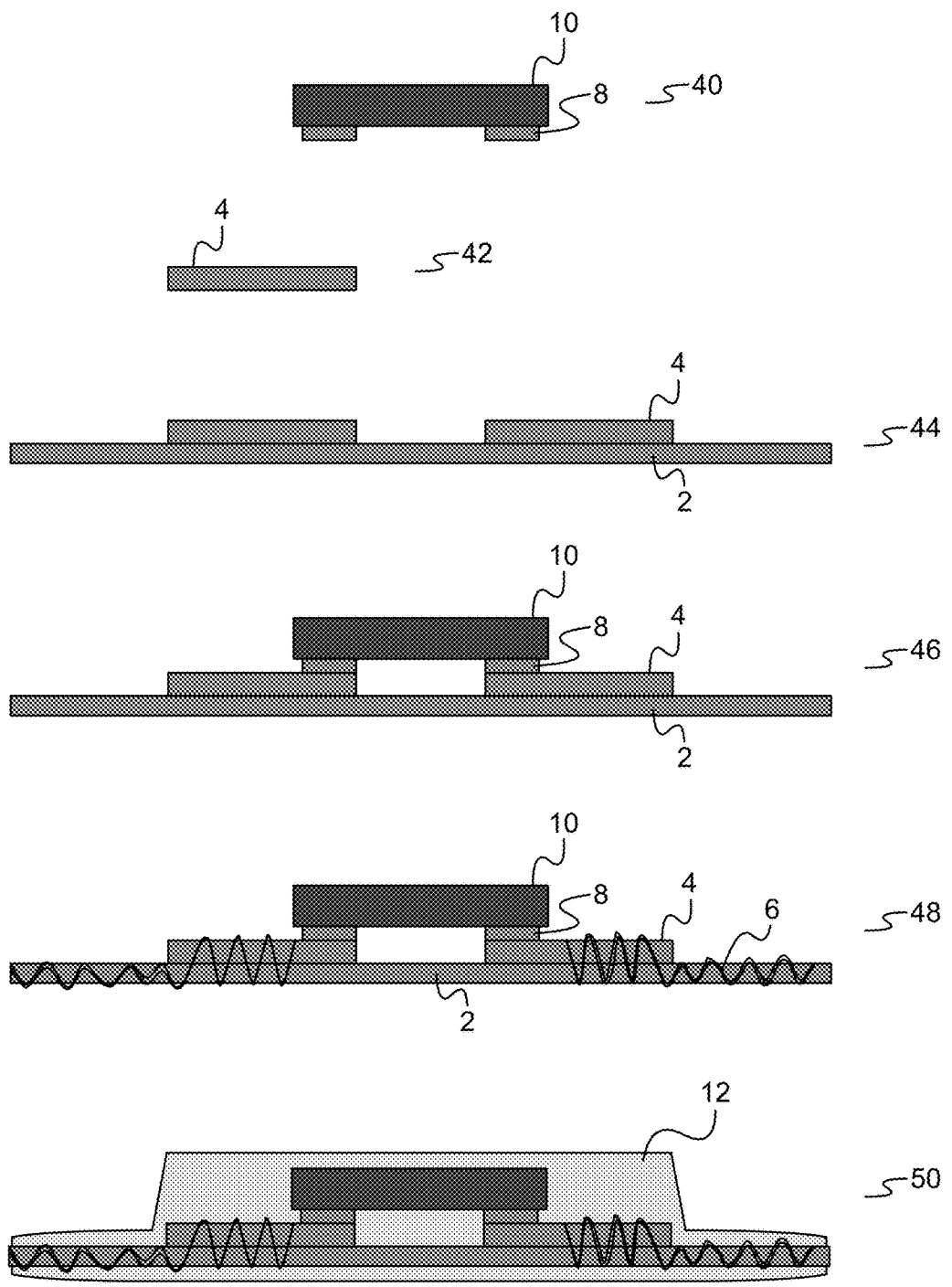
FIG. 3 illustrates another method of making an electronics assembly according to an embodiment.
Figure 4:
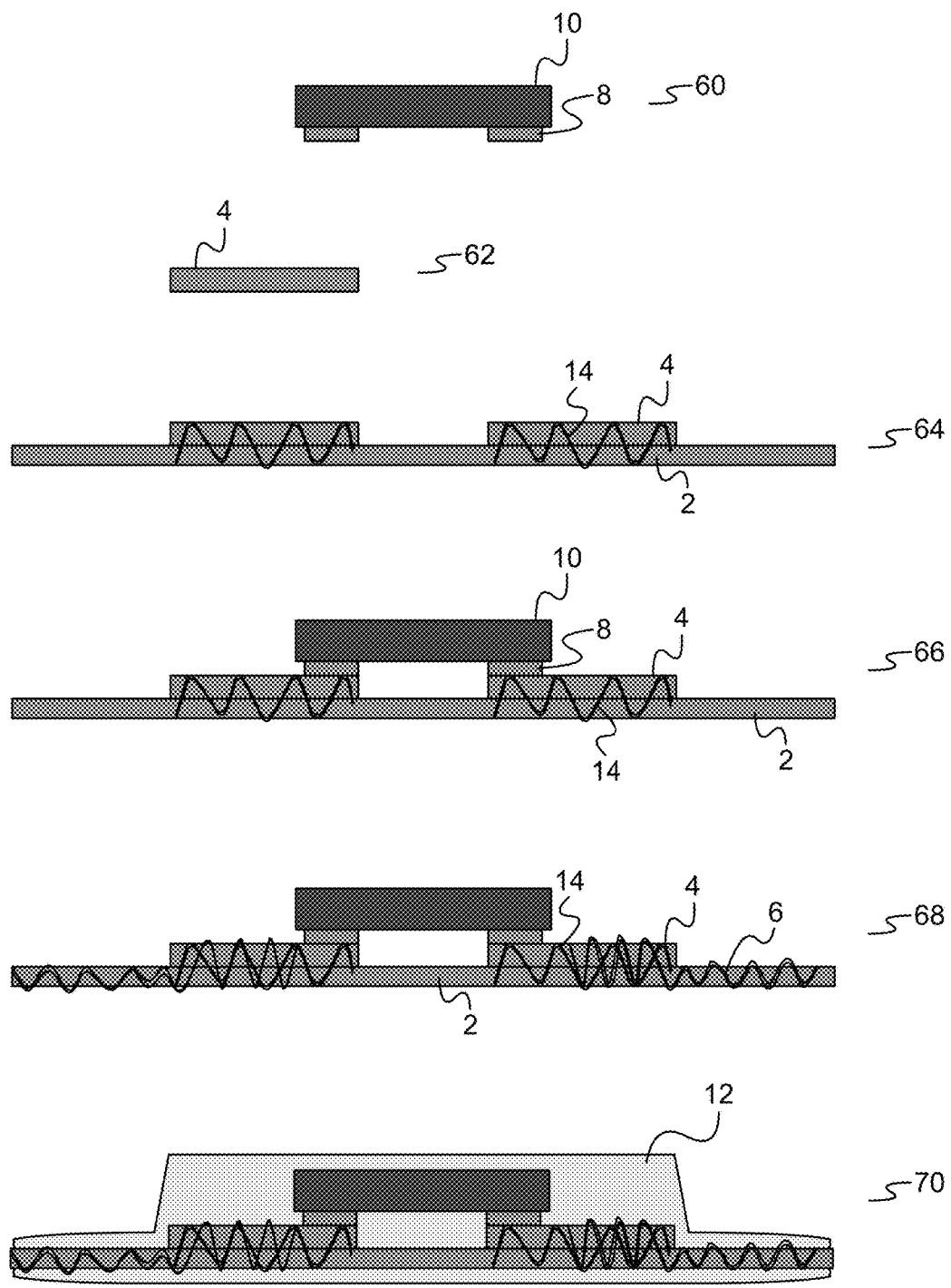
FIG. 4 illustrates yet another method of making an electronics assembly according to an embodiment.

In some embodiments, an encapsulation layer is added over the electronic component 10, the metal foil 4 and the stitched wire 6, such as an encapsulation layer 12 shown in FIG. 2-4. A backside encapsulation layer is also added over the stitched wire 6 on the backside of the fabric 2. In some embodiments, the encapsulation layer is an elastic material, such as an elastic polymer, or elastomer, which is a polymer with viscoelasticity. It is understood that alternative elastic substrates can be used including, but not limited to, silicone, urethane, latex and spandex, also referred to as elastane. The encapsulation layer provides environmental protection as well as electrical isolation of individual electrical connection points and wires.

The number and positions of the electrical connection points and corresponding metal foils extending from the electronic component varies by application. One or more metal foil can extend laterally from the electronic component in any direction. One or more stitches can be used to stitch electrically conductive wire to any given metal foil. The number and placement of electrically conductive wire stitches per metal foil can vary. For example, the metal foil 4 shown in FIG. 1 has three stitches of the electrically conductive wire 6. It is understood that there can be more or less than three stitches.

In some embodiments, the fabric includes one or more insulated wires intermixed with the fabric threads. An example of a fabric having intermixed insulated wires is found in the co-pending U.S. patent application Ser. No. 14/194,497, titled "Magnet Wire for Wearable Electronics Fabric", which is hereby incorporated in its entirety by reference. In some embodiments, the insulated wire includes an inner metal wire and an outer insulation layer. In some embodiments, the electrically conductive wire stitched to the metal foil is also electrically coupled to the metal wire within the insulated wire of the fabric.

As used herein, the term "intermix" generally refers to mixing or blending together and is applied herein to describe the manner by which an insulated wire, such as a magnet wire, is integrated as part of a fabric. The magnet wire is intermixed with the fabric using conventional methodologies, for example weaving, stitching, felting or knitting, and is intended to include, but not be limited to, such similar concepts as intertwining, interweaving, interspersing, interlacing, intermingling and the like of the magnet wire and fabric threads.

Magnet wire is typically made of a copper or aluminum wire coated with a very thin layer of insulation. Magnet wire is referred to as "magnet" due to its electromagnetic applications. Magnet wires can be used in the construction of transformers, inductors, motors, speakers, hard disk head actuators, potentiometers, electromagnets, and other applications which require tight coils of wire. The metal wire itself is most often fully annealed, electrolytically refined copper. Smaller diameter magnet wire usually has a round cross section. An example of this kind of wire is used for things such as electric guitar pickups. Thicker magnet wire is often square or rectangular with rounded corners to provide more current flow per coil length.

In some embodiments, magnet wire includes one to four layers of polymer film insulation, often of two different compositions, to provide a tough, continuous insulating layer. Materials used for magnet wire insulating films can include, but are not limited to, polyvinyl formal (Formvar™), polyurethane, polyamide, polyester, polyester-polyimide, polyamide-polyimide (or amide-imide), and polyimide. Polyimide insulated magnet wire is capable of operation at up to 250° C. In other embodiments, different types of insulation are used including, but not limited to, fiberglass yarn with varnish, aramid paper, kraft paper, mica, and polyester film. It is understood that are types of magnet wires can be used, for example a silver wire having various insulators, such as polytetrafluoroethylene (Teflon™), such as that found in the audio industry. For ease of manufacturing, newer magnet wires can have insulation that acts as a flux when burnt during soldering. This results in magnet wires having electrical connections at the ends that can be made without stripping off the insulation first. Older magnet wires do not have this type of insulation and can require sandpapering or scraping to remove the insulation before soldering.

There are various methodologies of making the electronic assembly including the electronics component, the metal foil and the fabric. FIG. 2 illustrates a method of making an electronics assembly according to an embodiment. For exemplary purposes, the method of FIG. 3 is described in terms of the electronic assembly of FIG. 1. At the step 20, the electronic component 10 is obtained. The electronic component includes one or more electrical connection points. In the exemplary case of the electronic component 10, there are two electrical connection points 8.

At the step 22, the metal foil 4 is obtained. In the exemplary case where there are two electrical connection points 8, there are two separate metal foils 4, one for each electrical connection point 8. In some embodiments, each metal foil is formed by cutting a larger piece of metal foil to a desired size and shape. Each metal foil 4 is selectively formed into application specific shapes based on design requirements and constraints.

At the step 24, one metal foil 4 is attached to one electrical connection point 8. The metal foil 4 can be attached by soldering, welding or using electrically conductive adhesive. It is understood that other conventional methods can be used to provide a mechanical and electrical connection between the electrical connection point and the metal foil. The metal foil 4 is shaped and attached such that once attached to the electrical connection point a portion of the metal foil extends laterally beyond a footprint of the electronic component 10.

At the step 26, the metal foils 4 are attached to the fabric 2. In some embodiments, the metal foils 4 are attached to the fabric 2 using an adhesive, which can be pre-applied to the metal foils 4, the fabric 2 or both. In some embodiments, a curing step is performed to secure the metal foils 4 and the fabric 2 to the adhesive.

At the step 28, each metal foil 4 is stitched to the fabric 2 using stitched electrically conductive wire 6. An optional additional step can be performed where the stitched electrically conductive wire 6 is electrically coupled to an insulated wire (not shown) intermixed in the fabric 2. Another optional additional step can be performed wherein a first end of the stitched electrically conductive wire 6 is stitched to the metal foil 4, as shown in FIG. 2, and a second end of the stitched electrically conductive wire 6 is stitched to another metal foil (not shown), where this other metal foil can be coupled to the electrical connection point of a different electronic component.

At the step 30, an encapsulation layer 12 is added over the electronic component 10, the metal foils 4 and the stitched electrically conductive wires 6.

Steps 24 and 26 are shown as attaching the metal foils 4 to the electrical connection points 8 prior to attaching the metal foils 4 to the fabric 2. This process can be reversed. FIG. 3 illustrates another method of making an electronics assembly according to an embodiment. The method of FIG. 3 is similar to that of the method of FIG. 2 except that the metal foils 4 are first attached to the fabric 2, then the electrical connection points 8 are attached to the metal foils 4. Specifically, at the step 40, the electronic component 10 is obtained. At the step 42, the electrically conductive metal foils 4 are obtained. At the step 44, the metal foils 4 are attached to the fabric 2. In some embodiments, the metal foils 4 are attached to the fabric 2 using an adhesive, which can be pre-applied to the metal foils 4, the fabric 2 or both. In some embodiments, a curing step is performed to secure the metal foils 4 and the fabric 2 to the adhesive.

At the step 46, the electronic component 10 is attached to the metal foil 4 such that one electrical connection point 8 is attached to a corresponding one metal foil 4. The metal foils 4 can be attached by soldering, welding or using electrically conductive adhesive. It is understood that other conventional methods can be used to provide a mechanical and electrical connection between the electrical connection point and the wire cloth. Each metal foil 4 is shaped and attached such that once attached to the electrical connection point a portion of the metal foil extends laterally beyond a footprint of the electronic component 10.

At the step 48, each metal foil 4 is stitched to the fabric 2 using stitched electrically conductive wire 6. An optional additional step can be performed where the stitched electrically conductive wire 6 is electrically coupled to an insulated wire (not shown) intermixed in the fabric 2. Another optional additional step can be performed wherein a first end of the stitched electrically conductive wire 6 is stitched to the metal foil 4, as shown in FIG. 3, and a second end of the stitched electrically conductive wire 6 is stitched to another metal foil (not shown), where this other metal foil can be coupled to the electrical connection point of a different electronic component.

At the step 50, the encapsulation layer 12 is added over the electronic component 10, the metal foils 4 and the stitched electrically conductive wires 6.

It is understood that the metal foils 4 can be attached to the fabric using alternative conventional attachment means. FIG. 4 illustrates yet another method of making an electronics assembly according to an embodiment. The method of FIG. 4 is similar to that of the method of FIG. 3 except that each metal foil is attached to the fabric by using a stitched thread. Specifically, at the step 60, the electronic component 10 is obtained. At the step 62, the electrically conductive metal foils 4 are obtained. At the step 64, the metal foils 4 are attached to the fabric 2. Each metal foil 4 is stitched to the fabric 2 using a stitched thread 14, which can be electrically conductive or electrically insulated. This stitched thread can be applied over a greater area of the metal foil 4 than the stitched wire 6. For example the stitched thread can be applied around a perimeter of each metal foil 4.

At the step 66, the electronic component 10 is attached to the metal foils 4 such that one electrical connection point 8 is attached to a corresponding one metal foil 4. Each metal foil 4 can be attached by soldering, welding or using electrically conductive adhesive. It is understood that other conventional methods can be used to provide a mechanical and electrical connection between the electrical connection point and the metal foil. Each metal foil 4 is shaped and attached such that once attached to the electrical connection point a portion of the metal foil extends laterally beyond a footprint of the electronic component 10.

At the step 68, each metal foil 4 is stitched to the fabric 2 using stitched electrically conductive wire 6. Portions of the stitched electrically conductive wire 6 and the stitched thread 14 may overlap. An optional additional step can be performed where the stitched electrically conductive wire 6 is electrically coupled to an insulated wire (not shown) intermixed in the fabric 2. Another optional additional step can be performed wherein a first end of the stitched electrically conductive wire 6 is stitched to the metal foil 4, as shown in FIG. 4, and a second end of the stitched electrically conductive wire 6 is stitched to another metal foil (not shown), where this other metal foil can be coupled to the electrical connection point of a different electronic component.

At the step 70, the encapsulation layer 12 is added over the electronic component 10, the metal foils 4 and the stitched electrically conductive wires 6. If the stitched thread 14 is electrically conductive, then the encapsulation layer 12 is also added over the stitched thread 14.

The exemplary configurations described above are directed to a single electronic component coupled to the fabric. It is understood that alternative configurations are configured that include more than one electronic component coupled to the fabric. In such embodiments, the stitched electrically conductive wire can be used to connect multiple electronic components, or to intervening insulated wires woven into the fabric, which in turn may be electrically coupled to other electronic components via stitched electrically conductive wires.

Although embodiments of the electronics assembly are described above as wearable electronics assembly, the general concepts described herein can be applied generally to electronics coupled to fabrics, wearable or otherwise.

The present application has been described in terms of specific embodiments incorporating details to facilitate the understanding of the principles of construction and operation of the products and methods. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electronics assembly comprising:
   a. a fabric;
   b. an electronic component comprising an electrical connection point;
   c. a metal foil coupled to the electrical connection point of the electronic component and stacked between the fabric and the electrical connection point, wherein an electrical connection is formed between the metal foil and the electrical connection point; and
   d. an electrically conductive wire stitched through the fabric and through the metal foil such that an electrical connection is formed between the electrically conductive wire and the metal foil.

2. The electronics assembly of claim 1 wherein the electrical connection point comprises a bond pad.

3. The electronics assembly of claim 1 wherein the electrical connection point comprises a solder bump.

4. The electronics assembly of claim 1 wherein the electrical connection point is coupled to the metal foil via a solder joint, a welded joint or an electrically conductive adhesive.

5. The electronics assembly of claim 1 wherein the metal foil is coupled to the fabric using an adhesive.

6. The electronics assembly of claim 1 wherein the metal foil is coupled to the fabric using a stitched non-electrically conductive thread.

7. The electronics assembly of claim 1 wherein the metal foil is coupled to the fabric using a second electrically conductive thread stitched to the fabric and to the electrically conductive metal foil.

8. The electronics assembly of claim 1 wherein the metal foil comprises one or more of copper, silver, nickel and their alloys.

9. The electronics assembly of claim 8 wherein the metal foil comprises an electrically conductive plating finish.

10. The electronics assembly of claim 1 further comprising an encapsulation layer coupled to the electronics component, the electrically conductive metal foil and the electrically conductive wire.

11. The electronics assembly of claim 1 wherein the fabric comprises an insulated wire including an inner metal wire and an outer insulation layer, further wherein the electrically conductive wire is electrically coupled to the inner metal wire of the insulated wire.

12. The electronics assembly of claim 1 wherein the electrically conductive wire stitched to the fabric comprises two separate wires, wherein the two separate wires comprise a metal wire and an insulation wire.

13. The electronics assembly of claim 1 wherein the electronics assembly is wearable.

14. A method of making an electronics assembly, the method comprising:
   a. attaching an electrical connection point of an electronic component to a metal foil, thereby forming an electrical connection between the metal foil and the electrical connection point;
   b. attaching the metal foil to a fabric, wherein the metal foil is stacked between the fabric and the electrical connection point; and
   d. stitching an electrically conductive wire through the fabric and through the metal foil such that an electrical connection is formed between the electrically conductive wire and the metal foil.

15. The method of claim 14 wherein attaching the electrical connection point of the electronic component to the metal foil comprises soldering, welding or using an electrically conductive adhesive.

16. The method of claim 14 wherein attaching the metal foil to the fabric comprises using an adhesive.

17. The method of claim 14 wherein attaching the metal foil to the fabric comprises stitching a non-electrically conductive thread to the electrically conductive wire cloth and to the fabric.

18. The method of claim 14 wherein attaching the metal foil to the fabric comprises stitching a second electrically conductive thread to the electrically conductive wire cloth and to the fabric.

19. The method of claim 14 further comprising adding an encapsulation layer coupled to the electronics component, the metal foil and the electrically conductive wire.

20. The method of claim 14 wherein the fabric comprises an insulated wire including an inner metal wire and an outer insulation layer, and the method further comprises electrically coupling the electrically conductive wire to the inner metal wire of the insulated wire.

21. The method of claim 14 wherein the electrically conductive wire stitched to the fabric comprises two separate wires, wherein the two separate wires comprise a metal wire and an insulation wire, and stitching the electrically conductive wire to the fabric comprises stitching the two separate wires.

22. The method of claim 14 wherein the electronics assembly is wearable.

* * * * *